United States Patent [19]

Lee

[11] Patent Number: 5,406,105
[45] Date of Patent: Apr. 11, 1995

[54] ELECTRO STATIC DISCHARGE PROTECTING CIRCUIT

[75] Inventor: Kyung S. Lee, Seoul, Rep. of Korea

[73] Assignee: Goldstar Electron Co., Ltd., Rep. of Korea

[21] Appl. No.: 260,196

[22] Filed: Jun. 15, 1994

[30] Foreign Application Priority Data

Aug. 18, 1993 [KR] Rep. of Korea ............... 16029/1993

[51] Int. Cl.⁶ .................... H01L 29/06; H02H 3/20
[52] U.S. Cl. .................... 257/355; 257/360; 257/379; 361/91
[58] Field of Search ........... 257/355, 356, 360, 368, 257/379; 361/56, 91

[56] References Cited

U.S. PATENT DOCUMENTS 4,605,980  8/1986  Hartranft et al. ............ 361/56

*Primary Examiner*—Mark V. Prenty
*Attorney, Agent, or Firm*—Poms, Smith, Lande & Rose

[57] ABSTRACT

An electro static discharge protection circuit capable of achieving an improvement in ESD protection characteristic by an isolation between the inner cell ground and the ESD protection circuit ground and use of a field oxide transistor. The protection circuit includes first and third p type wells formed at a peripheral circuit region of a n type substrate and a second p type well formed at a cell region of the substrate, a first p+ type impurity-diffused region, first, second and third n+ type impurity-diffused regions, all of the impurity-diffused regions being formed in the first p type well, a second p+ type impurity-diffused region formed in the second p type well, a third p+ type impurity-diffused region, fourth, fifth and sixth n+ type impurity-diffused regions, all of the impurity-diffused regions being formed in the third p type well, a field oxide film formed over a surface portion of the n type substrate between adjacent high concentration impurity-diffused regions formed in each of the first and third p type wells, and gate electrodes respectively formed on portions of the field oxide film disposed between the second and third n type impurity-diffused regions and between the fourth and fifth n type impurity-diffused regions.

7 Claims, 6 Drawing Sheets

ELECTRO STATIC DISCHARGE PROTECTING CIRCUIT

BACKGROUND OF THE INVENTION

The present invention relates to designing of semiconductor chips, and more particularly to an electro static discharge (ESD) protecting circuit adapted to provide an improvement a protection characteristic of a semiconductor chip.

Generally, semiconductor devices may be damaged due to an ESD phenomenon. Such a damage may occur at a wiring film or an oxide film. In either case, the damage may be considered as thermal damage.

The damage of oxide film means that a PN junction of a semiconductor device is partially melted due to an ESD phenomenon and thereby damaged. When the ESD phenomenon occurs, a current flows in the interface of the junction. This current flow results in an increase in temperature at the junction interface. As a result, a thermal runaway may occurs which causes a considerable decrease in resistance of the junction interface. Due to such a thermal runaway, the PN junction is partially melted and thereby damaged.

On the other hand, the damage of wiring film means that an aluminum wiring is fused due to a certain thermal factor and thereby opened by itself or bridged by the fused aluminum.

Such a damage of semiconductor device caused by the ESD phenomenon may be reduced using a primary method for removing the cause of ESD present around the devices. A secondary method may be also used which proposes the provision of an appropriate protection circuit for sequentially discharging ESD charging the device without affecting inner cells of the device.

The ESD protection circuit is constructed upon designing a semiconductor chip so as to protect inner cells from ESD generated at an external such as person or mechanical installation and a peripheral circuit. Typically, the ESD protection circuit is constituted by two pairs of diodes so as to discharge ESD charging a semiconductor device without affecting inner cells by utilizing forward and backward characteristics of the diodes.

Now, a conventional ESD protection circuit having the above-mentioned function will be described, in conjunction with FIGS. 1 to 3. FIG. 1 is a sectional view of the conventional ESD protection circuit. FIG. 2 is a circuit diagram of the ESD protection circuit shown in FIG. 1. FIG. 3 is a diagram illustrating an operation characteristic of the ESD protection circuit shown in FIG. 1.

As shown in FIG. 2, the ESD protection circuit includes four diodes $D_1$ to $D_4$. Referring to FIG. 1, the ESD protection circuit has a basic structure including an n type semiconductor substrate 1 and five p type wells 2 to 6. The first, second, third and fourth p type wells 2, 3, 5 and 6 are formed at a peripheral circuit region such that they are uniformly spaced from one another whereas the remaining p type well, namely the fifth p type well 4 is formed at a cell region where a circuit to be protected is formed.

For forming a diode structure having a PN junction in each p type well formed at the peripheral circuit region, a high concentration n type (n+) region and a high concentration p type (p+) region are formed in each p type well of the peripheral circuit region such that they are spaced a predetermined distance apart from each other.

In the p type well 4 formed at the cell region, a high concentration p type (p+) region is formed for reducing a contact resistance generated in the p type well 4. This p+ region of the p type well 4 is connected between a power supply source $V_{DD}$ and ground GND.

As shown in FIG. 2, the diode $D_1$ is coupled at its anode electrode (the p+ type region in the first p type well 2 shown in FIG. 1) to a first pad and at its cathode electrode (the n+ type region in the first p type well 2 shown in FIG. 1) to the power supply source $V_{DD}$. The diode $D_3$ is coupled at its cathode electrode (the n+ type region in the second p type well 3 shown in FIG. 1) to the first pad and at its anode electrode (the p+ type region in the second p type well 3 shown in FIG. 1) to the ground GND. The diode $D_2$ is coupled at its anode electrode (the p+ type region in the fourth p type well 6 shown in FIG. 1) to a second pad and at its cathode electrode (the n+ type region in the fourth p type well 6 shown in FIG. 1) to the power supply source $V_{DD}$. The diode $D_4$ is coupled at its cathode electrode (the n+ type region in the third p type well 5 shown in FIG. 1) to the second pad and at its anode electrode (the p+ type region in the third p type well 5 shown in FIG. 1) to the ground GND.

Operation of the conventional ESD protection circuit having the above-mentioned structure will now be described.

When the first pad is charged with ESD, the diodes $D_1$ and $D_3$ define a discharge path together and discharge the ESD through the defined discharge path without affecting the inner cell. On the other hand, when the second pad is charged with ESD, the inner cell can be protected by the diodes $D_2$ and $D_4$ which define an ESD discharge path together.

As shown in FIG. 3 illustrating the operation characteristic at each ESD discharge path, the conventional ESD protection circuit utilizes the forward characteristics of the diodes, namely, the diodes $D_1$ and $D_2$ and the backward characteristics of the diodes, namely, the diodes $D_3$ and $D_4$ simultaneously.

In the conventional ESD protection circuit, the discharge capability at each ESD discharge path is dependent on the area and concentration of the PN junction of each diode. For improving the performance of the ESD protection circuit, it is required to use an additional masking process upon designing the circuit. Furthermore, leakage current possibly generating at the PN junction affects directly the circuit performance when the device operates at a normal state.

SUMMARY OF THE INVENTION

Therefore, an object of the invention is to solve the above-mentioned problems encountered in the prior art and, thus, to provide an ESD protection circuit capable of achieving an improvement in ESD protection characteristic by an isolation between the inner cell ground and the ESD protection circuit ground and use of a field oxide transistor.

In accordance with the present invention, this object can be accomplished by providing an electro static discharge protection circuit for a semiconductor device having a semiconductor substrate of a first conduction type, comprising: a first well of a second conduction type formed at a peripheral circuit region of the semiconductor substrate, a second well of the second conduction type formed at a cell region of the semiconductor substrate, and a third well of the second conduction type formed at the peripheral circuit region of the semiconductor substrate and spaced a predetermined distance apart from the first well; a first second-conduction-type high concentration impurity-diffused region, a first first-conduction-type high concentration impurity-diffused region, a second first-conduction-type high concentration impurity-diffused region and a third first-conduction-type high concentration impurity-diffused region, all of the impurity-diffused regions being formed in the first second-conduction-type well and uniformly spaced a predetermined distance apart from one another; a second second-conduction-type high concentration impurity-diffused region formed in the second second-conduction-type well; a third second-conduction-type high concentration impurity-diffused region, a fourth first-conduction-type high concentration impurity-diffused region, a fifth first-conduction-type high concentration impurity-diffused region and a sixth first-conduction-type high concentration impurity-diffused region, all of the impurity-diffused regions being formed in the third second-conduction type well and uniformly spaced a predetermined distance apart from one another; a field oxide film formed over a surface portion of the n type semiconductor substrate between adjacent high concentration impurity-diffused regions formed in each of the first and third second-conduction-type wells; and gate electrodes respectively formed on portions of the field oxide film disposed between the second and third first-conduction-type impurity-diffused regions and between the fourth and fifth first-conduction-type impurity-diffused regions.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1:
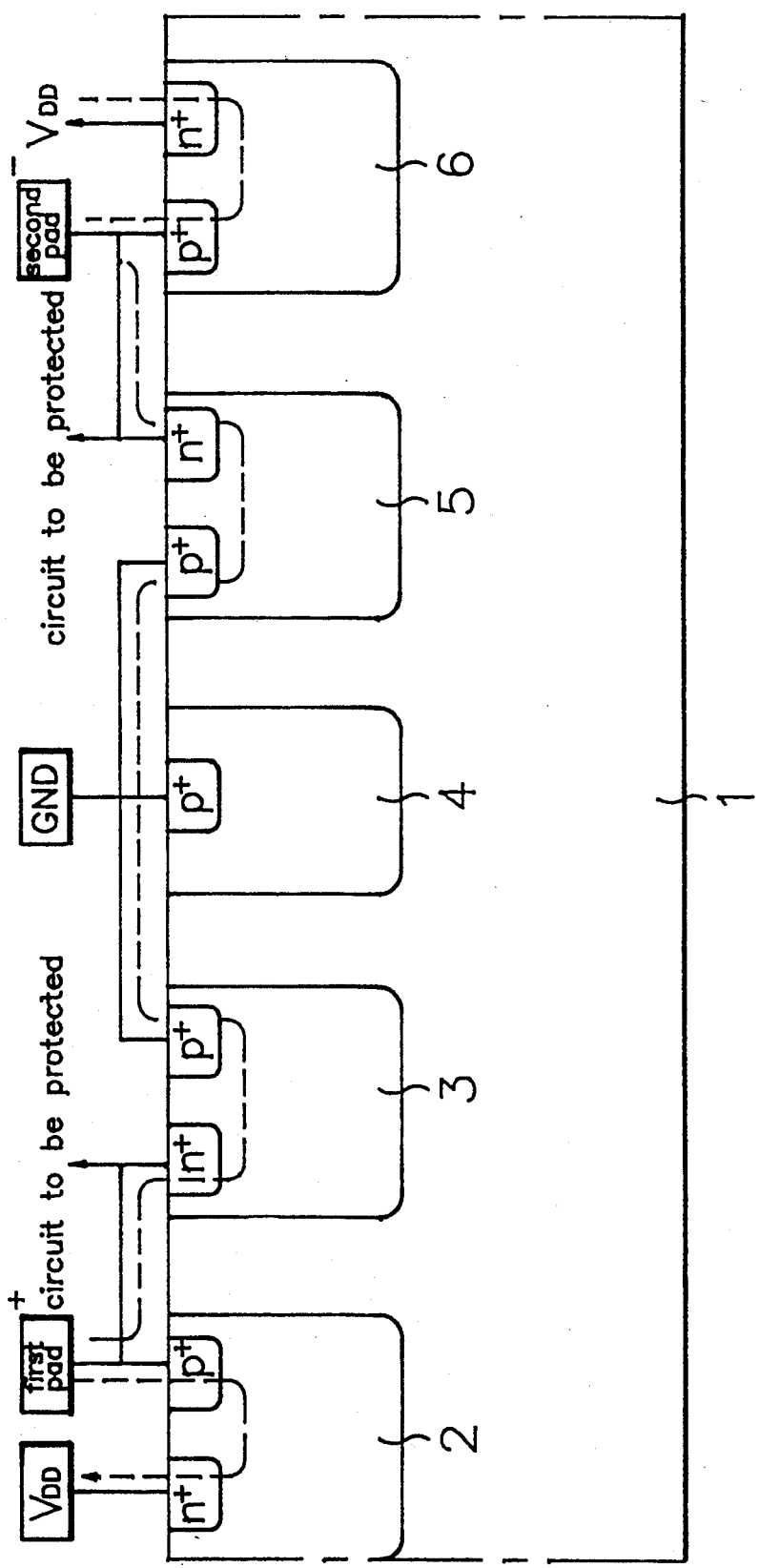
FIG. 1 is a sectional view of the conventional ESD protection circuit.
Figure 2:
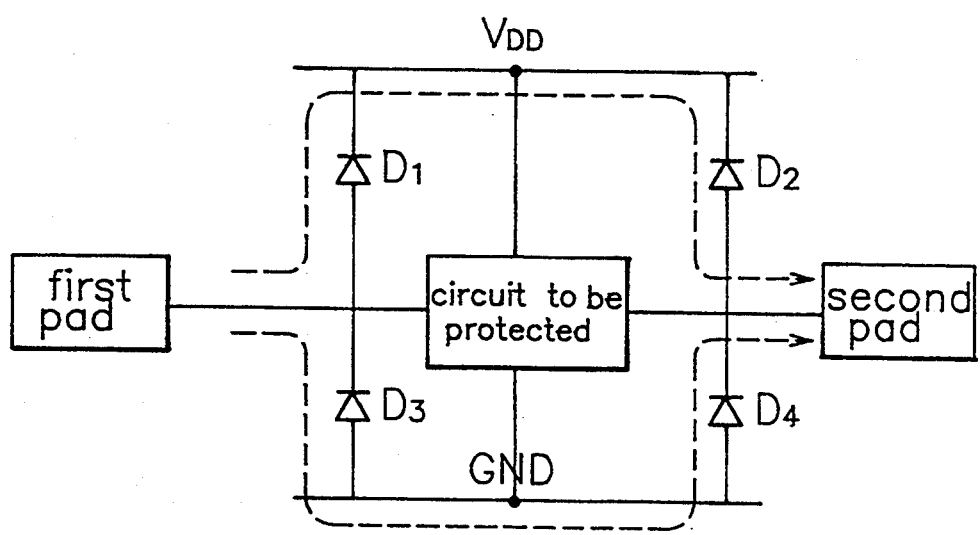
FIG. 2 is a circuit diagram of the ESD protection circuit shown in FIG. 1.
Figure 3:
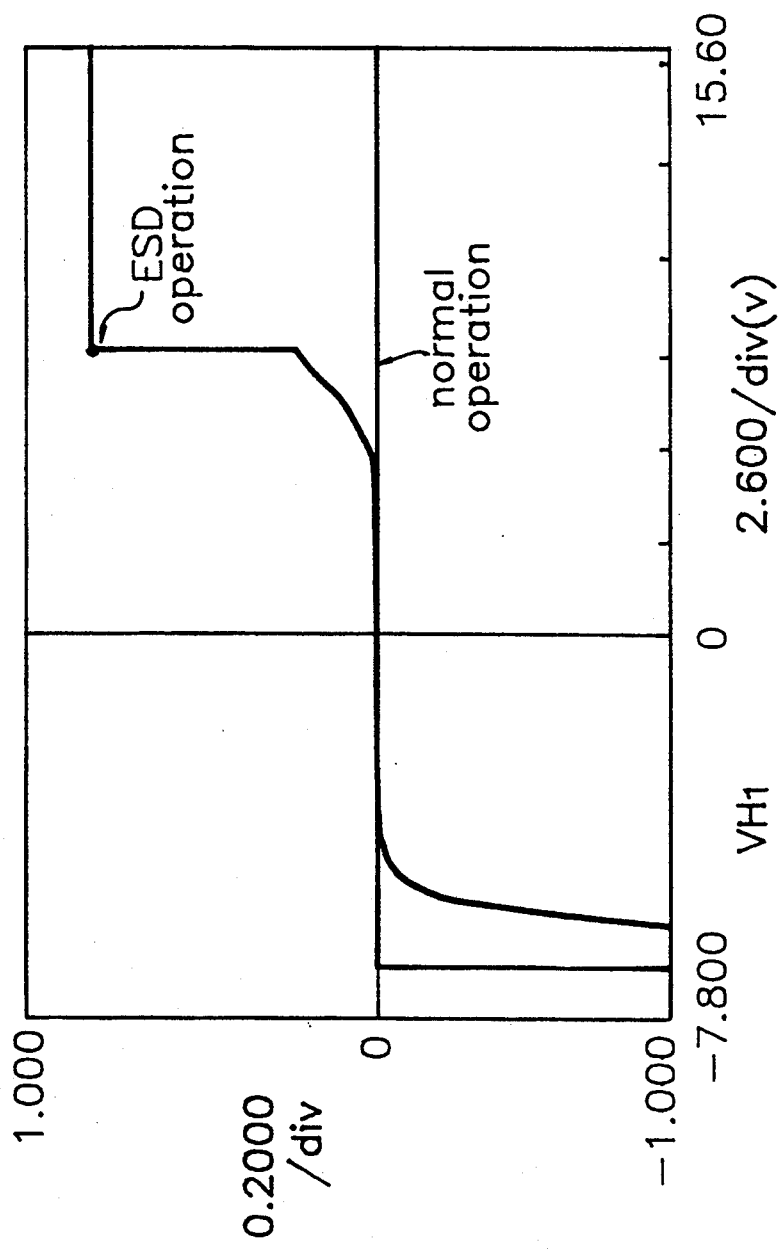
FIG. 3 is a diagram illustrating an operation characteristic of the ESD protection circuit shown in FIG. 1.
Figure 4:
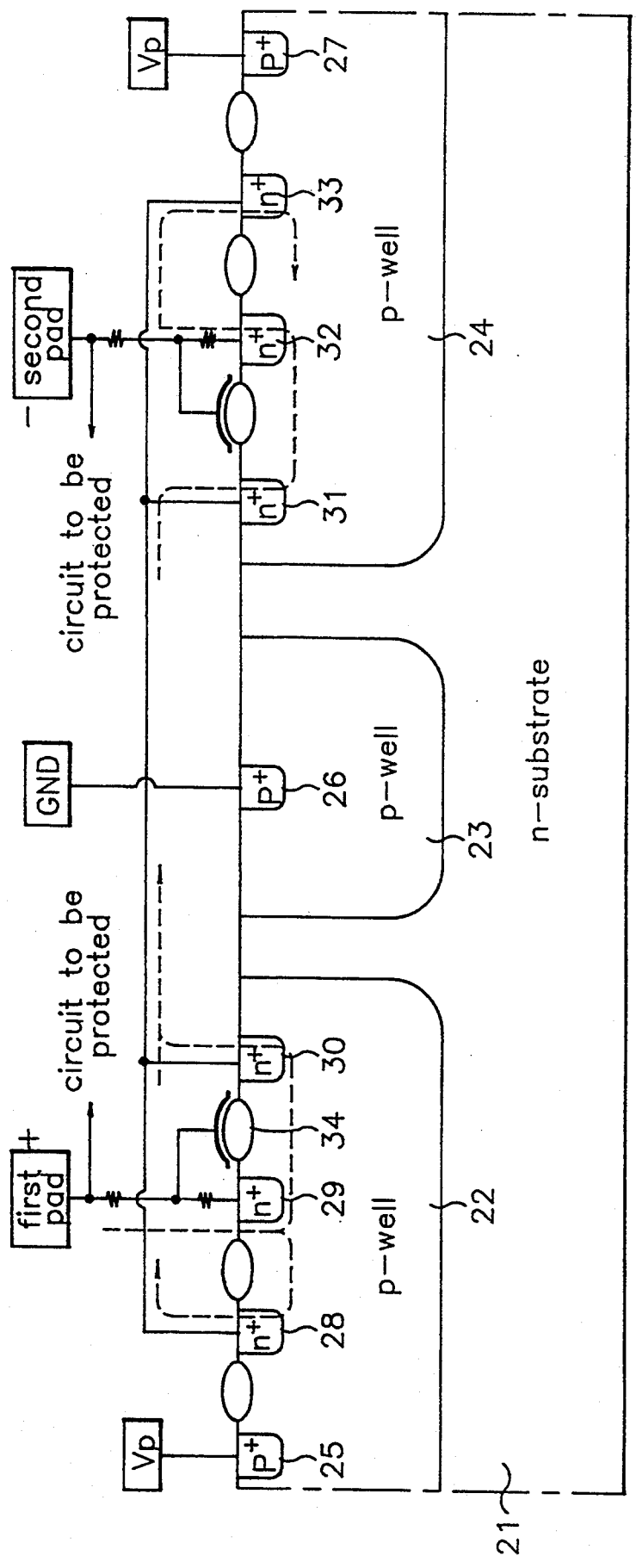
FIG. 4 is a sectional view of an ESD protection circuit in accordance with the present invention.
Figure 5:
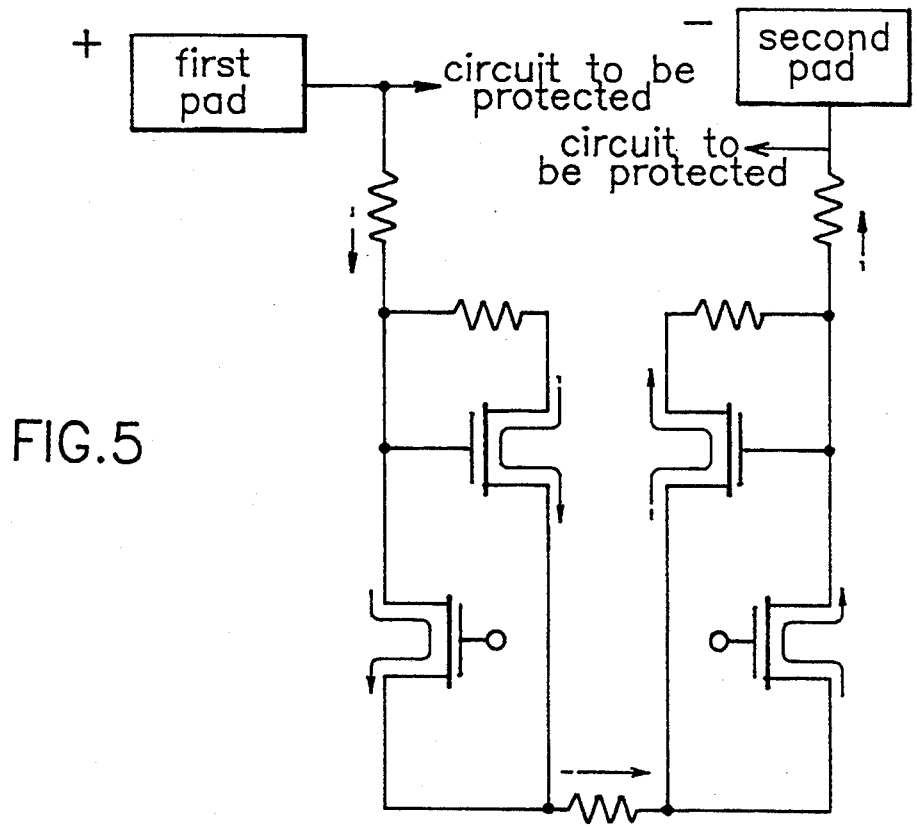
FIG. 5 is a circuit diagram of the ESD protection circuit shown in FIG. 4.
Figure 6:
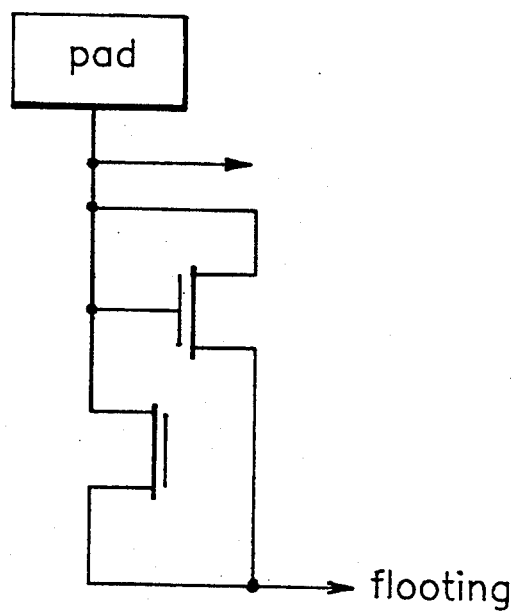
FIG. 6 is a circuit diagram of the ESD protection circuit shown in FIG. 4 at a normal state.
Figure 7:
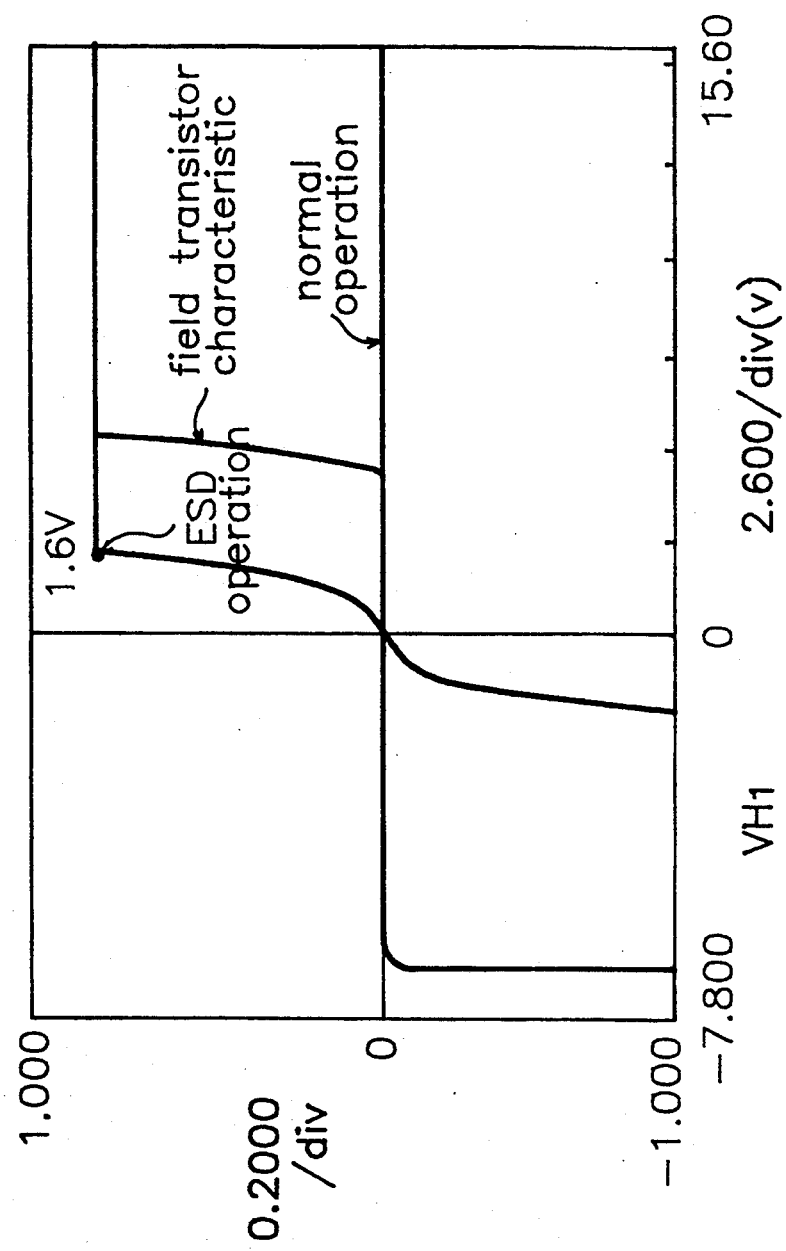
FIG. 7 is a diagram illustrating an operation characteristic of the ESD protection circuit shown in FIG. 4.

An ESD protection circuit for a semiconductor device in accordance with the present invention will now be described, in conjunction with FIGS. 4 to 7. FIG. 4 is a sectional view of the ESD protection circuit in accordance with the present invention. FIG. 5 is a circuit diagram of the ESD protection circuit shown in FIG. 4. FIG. 6 is a circuit diagram of the ESD protection circuit shown in FIG. 4 at a normal state. On the other hand, FIG. 7 is a diagram illustrating an operation characteristic of the ESD protection circuit shown in FIG. 4.

As shown in FIG. 4, the ESD protection circuit includes a semiconductor substrate 21 of a first conduction type, a first well 22 of a second conduction type formed at a peripheral circuit region of the semiconductor substrate 21, a second well 23 of the second conduction type formed at a cell region of the semiconductor substrate 21, and a third well 24 of the second conduction type formed at the peripheral circuit region of the semiconductor substrate 21 and spaced apart from the first well 22. The first well 22 of the second conduction type has a first second-conduction-type high concentration impurity-diffused region 25, a first first-conduction-type high concentration impurity-diffused region 28, a second first-conduction-type high concentration impurity-diffused region 29 and a third first-conduction-type high concentration impurity-diffused region 30, all of the impurity-diffused regions being uniformly spaced apart from one another.

In the illustrated case, the first conduction type is an n type whereas the second conduction type is a p type.

The first p+ type impurity-diffused region 25 is connected to a source voltage $V_p$ whereas the second n+ type impurity-diffused region 29 is connected to a first pad which is charged with ESD at input side of the device.

The second p type well 23 has a second second-conduction-type high concentration impurity-diffused region 26 connected to a GND terminal and thereby grounded.

The third type well 24 has a third second-conduction-type high concentration impurity-diffused region 27, a fourth first-conduction-type high concentration impurity-diffused region 31, a fifth first-conduction-type high concentration impurity-diffused region 32 and a sixth first-conduction-type high concentration impurity-diffused region 33, all of the impurity-diffused regions being uniformly spaced apart from one another.

The third p+ type impurity-diffused region 27 is connected to the source voltage $V_p$ whereas the fifth n+ type impurity-diffused region 32 is connected to a second pad which is charged with ESD at output side of the device.

A field oxide film 34 is disposed over a surface portion of the n type semiconductor substrate 21 between adjacent high concentration impurity-diffused regions formed in each of the first and third p+ wells 22 and 24.

A gate electrode is formed on the field oxide film 34 disposed between the second and third n+ type impurity-diffused regions 29 and 30. Another gate electrode is formed on the field oxide film 34 disposed between the fourth and fifth n+ type impurity-diffused regions 32 and 34.

The first, third, fourth and sixth n+ type impurity-diffused regions are connected in common.

Now, operation of the ESD protection circuit having the above-mentioned structure will be described.

When the fist pad of the input side of the device is charged with ESD, as shown in FIG. 5 illustrating a static electricity discharge circuit, an ESD discharge path is defined by a punch-through characteristic and a turn-on characteristic of two field oxide transistors constituted by the first, second and third n+ type impurity-diffused regions 28, 29 and 30 of the first p type well 22 shown in FIG. 4. Another discharge path is also defined at the output side of the device by a punch-through characteristic and a turn-on characteristic of two field oxide transistors constituted by the fourth, fifth and sixth n+ type impurity-diffused regions 31, 32 and 33 of the second p type well 24 shown in FIG. 4. The remaining ESD is finally discharged to the second pad through the discharge path at the output side of the device.

As the second pad at the output side of the device is charged with ESD, discharge of the ESD along a reverse path is accomplished without affecting the inner cell.

When the device operates at a normal state, the source voltage $V_p$ is applied to the device. At this time, the pads are subjected to the lowest one of voltage applied upon chip operation. One of the field oxide transistors is electrically floated (of course, it is connected with a corresponding one of neighboring ESD protection circuit) and thereby kept at its turn-off state. As a result, no leakage current flows in the ESD protection circuit, thereby causing the applied voltage to be applied to the inner cell.

In other words, the inner cell of the device is isolated from the ESD protection circuit because no current flows in the ESD protection circuit by bias applied to the source voltage $V_p$ at the normal operation, as shown in FIG. 6.

As apparent from the above description, the ESD protection circuit of the present invention enables a large amount of current to flow in a short time because ESD is discharged by the punch-through and turn-on characteristics of the field oxide transistors obtained upon charging ESD. Accordingly, it is possible to improve the function of protecting the inner cell against ESD, as shown in FIG. 7 illustrating the operation characteristic of the ESD protection circuit of the present invention.

In accordance with the present invention, the ground of the ESD protection circuit is isolated from the ground of the inner cell so as to use only the ground line of the ESD protection circuit. Accordingly, the performance of the ESD protection circuit can be improved separately from the inner cell upon designing the circuit.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. An electro static discharge protection circuit for a semiconductor device having a semiconductor substrate of a first conduction type, comprising:

a first well of a second conduction type formed at a peripheral circuit region of the semiconductor substrate, a second well of the second conduction type formed at a cell region of the semiconductor substrate, and a third well of the second conduction type formed at the peripheral circuit region of the semiconductor substrate and spaced a predetermined distance apart from the first well;

a first second-conduction-type high concentration impurity-diffused region, a first first-conduction-type high concentration impurity-diffused region, a second first-conduction-type high concentration impurity-diffused region and a third first-conduction-type high concentration impurity-diffused region, all of the impurity-diffused regions being formed in the first second-conduction-type well and uniformly spaced a predetermined distance apart from one another;

a second second-conduction-type high concentration impurity-diffused region formed in the second second-conduction-type well;

a third second-conduction-type high concentration impurity-diffused region, a fourth first-conduction-type high concentration impurity-diffused region, a fifth first-conduction-type high concentration impurity-diffused region and a sixth first-conduction-type high concentration impurity-diffused region, all of the impurity-diffused regions being formed in the third second-conduction type well and uniformly spaced a predetermined distance apart from one another;

a field oxide film formed over a surface portion of the first conduction type semiconductor substrate between adjacent high concentration impurity-diffused regions formed in each of the first and third second-conduction-type wells; and gate electrodes respectively formed on portions of the field oxide film disposed between the second and third first-conduction-type impurity-diffused regions and between the fourth and fifth first-conduction-type impurity-diffused regions.

2. An electro static discharge protection circuit in accordance with claim 1, wherein the first second-conduction type high concentration impurity-diffused region is connected to a power source voltage.

3. An electro static discharge protection circuit in accordance with claim 1, wherein the second second-conduction type high concentration impurity-diffused region is connected to a ground terminal.

4. An electro static discharge protection circuit in accordance with claim 1, wherein the third second-conduction type high concentration impurity-diffused region is connected to a power source voltage.

5. An electro static discharge protection circuit in accordance with claim 1, wherein the second first-conduction type high concentration impurity-diffused region is connected to a first pad.

6. An electro static discharge protection circuit in accordance with claim 1, wherein the fifth first-conduction type high concentration impurity-diffused region is connected to a second pad.

7. An electro static discharge protection circuit in accordance with claim 1, wherein the first, third, fourth and sixth first-conduction type high concentration impurity-diffused regions are connected to one another.

* * * * *